United States Patent [19]

Penato

[11] Patent Number: 4,571,286

[45] Date of Patent: Feb. 18, 1986

[54] PROCESS FOR SELECTIVELY DEPOSITING A REFRACTORY METAL LAYER ON A GRAPHITE PIECE

[75] Inventor: Jean-Marie Penato, Les Essart Le Roi, France

[73] Assignee: Thomson-CSF, Paris, France

[21] Appl. No.: 540,557

[22] Filed: Oct. 11, 1983

[30] Foreign Application Priority Data

Oct. 29, 1982 [FR] France ............................ 82 18246

[51] Int. Cl.⁴ .................... C25D 5/02; C25D 5/10; B05D 1/32; B05D 5/12
[52] U.S. Cl. .................................. 204/15; 204/38.5; 204/40; 427/113; 427/259; 427/265
[58] Field of Search .................. 427/259, 265, 113; 204/15, 38.5, 40

[56] References Cited

U.S. PATENT DOCUMENTS 4,424,271 1/1984 Keel et al. .................... 427/259 X

OTHER PUBLICATIONS

IBM Technical Disclosure Bulletin, vol. 11, No. 11, Apr., 1969, New York (U.S.).
F. J. Landler et al.: "Eliminating Undercutting on Thick Metal Film and Manufacturing Thin Metal Masks", pp. 1607-1608.

Primary Examiner—Evan K. Lawrence

[57] ABSTRACT

A process for selectively depositing a tungsten or tantalum refractory metal on a graphite piece, particularly for X-ray tube anodes, wherein the graphite piece is masked on selected surfaces, an intermediate layer of a coating material is deposited on unmasked surfaces to promote adhesion of the refractory metal followed by removal of the masking and deposition of the refractory metal on all surfaces, and finally removing from the formerly masked surfaces refractory metal poorly adhered thereto.

8 Claims, 4 Drawing Figures

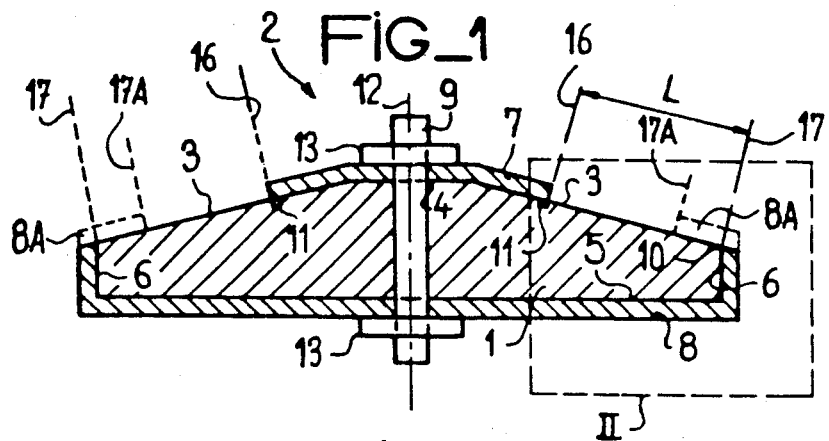
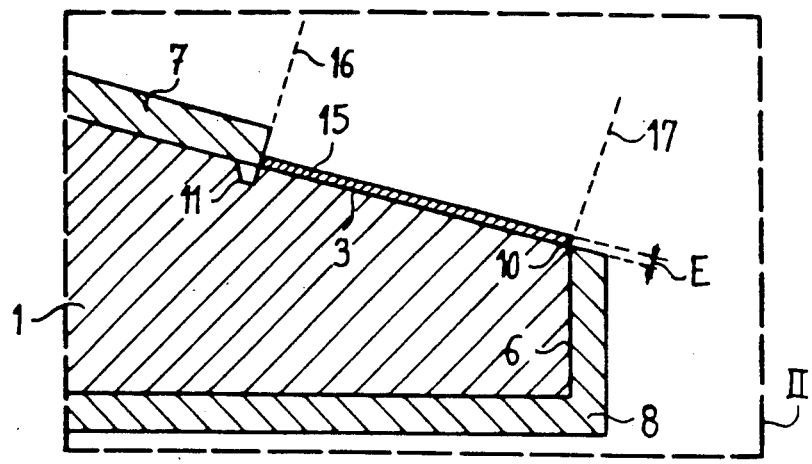
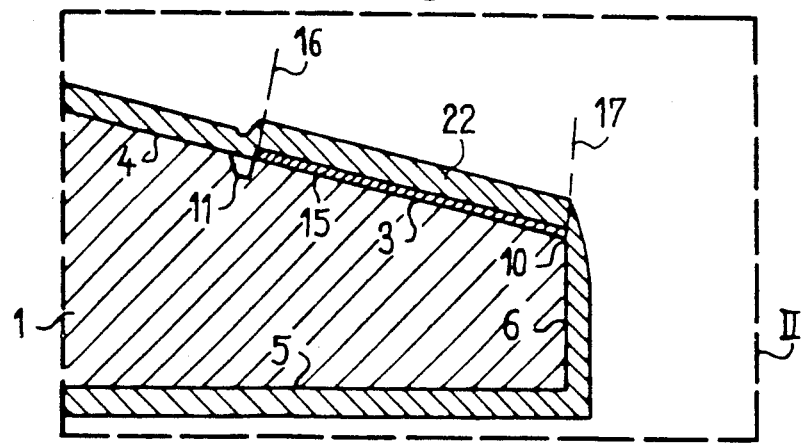

FIG_4
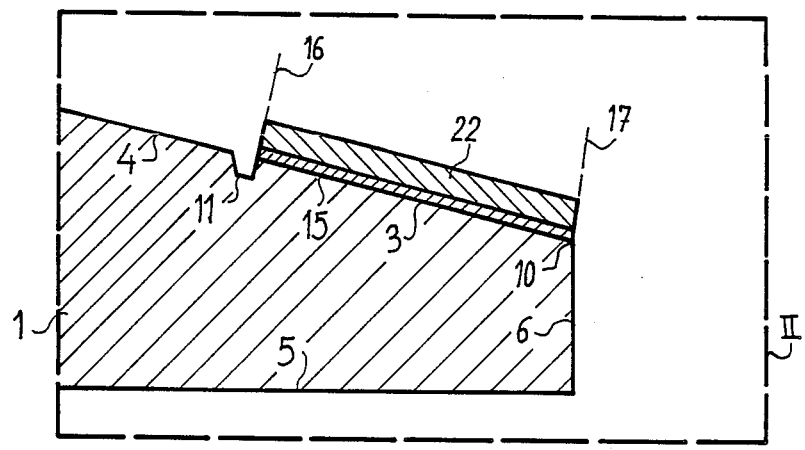

PROCESS FOR SELECTIVELY DEPOSITING A REFRACTORY METAL LAYER ON A GRAPHITE PIECE

BACKGROUND OF THE INVENTION

1. Field of the Invention

The present invention relates to a process for selectively depositing a refractory metal layer on a piece made from graphite, applicable in cases where such metal must be deposited on a limited surface of the graphite piece, as for example, in the manufacture of anodes for X-ray tubes.

2. Description of the Prior Art

Taking for example X-ray tubes having a rotary anode, they are currently called on to withstand high electric power, for varying operating times, to build up a charge. The power applied during this charge is intended to generate an electron flow, focussed on a small surface of the anode called the focal point, this surface becoming the source of X-rays. Rotation of the anode defines a focal ring formed by the surface of the rotating focal point.

The surface of this focal ring is generally formed by a metal or a metal compound, preferably refractory and with a high atomic number, such as tungsten or tantalum for example.

A small part of the energy received by the X-ray tube during the application of a charge is transformed into X-rays, the rest being dissipated in the form of heat, the removal of which from the anode can only take place by radiation. This is why it is of the greatest importance, with an anode formed from a graphite disk, for example, to limit the surface of the refractory metal at the surface of the focal ring, thus allowing a greater graphite surface to be obtained, which is capable of better heat radiation than the refractory metal.

The refractory metal surface forming the focal ring may be obtained by depositing a layer of the metal on the graphite disk; for that it is generally necessary to previously deposit a so-called intermediate layer over the whole surface of the disk, which allows more particularly a sufficient adhesion of the metal to the graphite to be obtained. Deposition of the refractory metal layer may then be achieved by different methods such as: gaseous phase chemical deposit, igneous electrolysis, plasma, vacuum deposit, etc.

Up to now, delimitation of the surface of the refractory metal deposit is obtained by using masks, these masks being disposed during the operations for depositing the refractory metal layer on the surfaces where such metal is undesirable.

This method of defining the refractory metal surfaces presents the following numerous drawbacks:

taking into account the environment to which the masks are exposed, during the operations for depositing the refractory metal layer, these masks are made from an expensive material, such as graphite, for example;

these masks require complex machining to give them, for example, the shape of half shells, which must be assembled together to protect peripheral surfaces of the disk from the refractory metal;

because of the addition of these masks, there is caused an increase of the total volume of the disk to be treated, which may lead to modification of the operating conditions during depositing of the refractory metal layer;

refractory metal is deposited on the masks themselves which leads, on the one hand, to an increase in the consumption of the metal and, on the other hand, to a variation in the size of the masks, detrimental to re-use thereof, since the limits of the protected zones are modified after each use.

SUMMARY OF THE INVENTION

The present invention relates to a process for obtaining on a graphite piece first surfaces of refractory metal and second surfaces free of this metal, without requiring the use of complex and expensive masks such as previously mentioned. Such an improvement is due more particularly to the fact that the selection of these first and second surfaces takes place, in the process of the invention, in a manner different from that in which it is accomplished in prior art processes.

In accordance with the invention, there is provided a process for selectively depositing a refractory metal layer on a graphite piece, the refractory metal being formed by tungsten or tantalum, comprising first forming a deposit of an intermediate layer only on first selected surfaces to promote adhesion of the metal, so as to facilitate on second selected surfaces, after the refractory metal layer has been deposited over the whole of the piece, selective removal of the refractory metal layer from the second selected surfaces.

Thus, a process in accordance with the invention allows selection between these first and second surfaces to be made as soon as the intermediate layer is deposited; thus, before the refractory metal layer is deposited, first graphite surfaces are obtained to which the adhesion of the metal will be satisfactory and second surfaces to which this adhesion will be practically zero.

BRIEF DESCRIPTION OF THE DRAWINGS

The invention will be better understood from reading the following description and from examination of the three accompanying figures, in which:

FIG. 1 shows in cross section a graphite piece intended to receive, in accordance with the process of the invention, an intermediate layer before a refractory metal layer is deposited;

FIG. 2 shows the graphite piece after an intermediate layer has been deposited;

FIG. 3 shows the graphite piece after the refractory metal layer has been deposited; and FIG. 4 shows the graphite piece after poorly adhered metal has been removed therefrom.

DESCRIPTION OF THE PREFERRED EMBODIMENT

FIG. 1 shows a graphite piece 1 formed in the non-limiting example of the description by an anode disk for an X-ray tube (not shown); this piece or disk 1 allowing one phase of a first version of the process of the invention to be illustrated.

Disk 1 comprises an upper face generally indicated at 2 on which a first surface 3 of revolution is intended to form a focal ring and will receive a refractory metal layer (not shown in FIG. 1); this metal being formed by tantalum or, as in the non limiting example of the description, by tungsten. The first surface 3 is centered about an axis 12 of rotation of disk 1, between an inner limit 16 and an outer limit 17 (shown with broken lines) which define a width L thereof. Disk 1 comprises a groove 11 formed in the upper surface 3, this groove 11 coinciding with the inner limit 16; the outer limit 17 being formed by a line of intersection situated at the periphery of the upper surface 3.

Disk 1 also comprises second upper, lower and peripheral second surfaces 4,5,6 which, as mentioned above, will be free of tungsten so as to promote heat radiation.

In this first version of the invention, before effecting a deposit of an intermediate layer (not shown in FIG. 1) on disk 1, the second surfaces 4,5,6 are masked. For this purpose there is disposed on the upper face 2, a mask 7 masking the second upper surface 4; and a second mask 8 masking the second lower surface 5 and the peripheral surface 6 of disk 1.

These masks 7,8 are secured to disk 1 by conventional fixing means such as, for example, a screw 9 and nuts 13 as is shown in FIG. 1; screw 9 passing through a hole (not shown) disposed along the axis of rotation 12 of disk 1.

This forms a non limiting example of desired positions and shapes of masks 7,8 which may be modified, for example, depending on the width L and an arrangement of the focal ring shown by the first surface 3. Thus, for example, the second mask 8 may comprise an upper part 8A, shown with a broken line in FIG. 1, covering the upper face 2 at its periphery, and defining a second outer limit 17A for the first surface 3; this upper part 8A being possibly in this case formed by a flexible material, such as rubber, for example, so as to facilitate positioning of the second mask 8.

Then the intermediate layer is deposited, by a conventional method, such as aqueous electrolysis, for example. This leads to stating that masks 7,8 should be formed from an electrically insulating material, inert with respect to the aqueous bath, such as, for example, rubber, epoxy resin or even polytetrafluoroethylene; such materials being simple to mold or machine.

The drawing of FIG. 1 comprises a box II shown with a broken line and partially enclosing disk 1 and masks 7,8; this box II being intended to form the following FIGS. 2 and 3.

FIG. 2 shows in box II disk 1 and masks 7,8 after the previously mentioned intermediate layer 15 has been deposited.

This intermediate layer 15, whose composition is conventional, may be formed by rhenium for example and has a small thickness E of about 0.01 mm; it is deposited solely on the first surface 3, which in the example described is the only one not to be masked by masks 7,8.

It should be noted, in fact, that since these masks are formed by an insulating material, they are not covered by the intermediate layer 15; thus, their dimensions are maintained, which allows them to be re-used and thus considerably reduces the cost thereof.

Upon removing the masks 7,8, a disk 1 is obtained on which, as mentioned above, the intermediate layer 15 exists solely over the first surface 3.

It should also be noted that the limits 16,17 of surface 3, on which the intermediate layer 15 is deposited, coincide, one with the line of intersection 10 formed by the junction of the first surface 3 and the second peripheral surface 6, and the other with the groove 11; as will be explained further as this allows easier removal of the tungsten.

After having deposited the intermediate layer 15 and removed masks 7,8, a tungsten layer (not shown in FIG. 2) is deposited on disk 1.

In the non-limiting example described, this tungsten deposit is provided by a conventional method, such as, for example, vacuum depositing or igneous electrolysis.

FIG. 3 shows in box II disk 1 covered by a tungsten layer 22 over the whole of its surface; the whole of its surface being formed, on the one hand, by the second surfaces 4,5,6 and, on the other hand, by the first surface 3, to which the tungsten layer 22 adheres through the intermediate layer 15.

The next operation consists in removing the tungsten deposited on the second layers 4,5,6, so as to keep the tungsten layer 22 only between the inner and outer limits 16,17 of the first surface 3. Since the second surfaces 4,5,6 are not covered with the intermediate layer 15, when the tungsten layer 22 is deposited, the adhesion of the tungsten layer to these second surfaces is considerably reduced which facilitates removal thereof from these surfaces.

This removal is achieved by mechanical means for dislodging the tungsten, such as shocks, for example. The resulting product is shown in FIG. 4.

If necessary, removal of the tungsten from these second surfaces 4,5,6 may be further improved by heating the disk 1 above 1000° C.; this heating being carried out in a protecting atmosphere, such as argon, for example, or in a vacuum.

Machining may also remove the tungsten from these second surfaces, without causing, as is the case in the prior art, damage to the tungsten layer to be kept; in fact, removal by machining of perfectly adherent tungsten would cause mechanical stresses likely to lead to cracks in the tungsten layer to be kept.

Such machining is possible in the process of the invention, because, on the one hand, of the difference in adhesion of the tungsten between the first and second surfaces 3 and 4, 5,6 and, on the other hand, because of fragilization of the tungsten layer 22 at limits 16,17 where it is to be removed.

This fragilization of the tungsten layer 22 is obtained, in the process of the invention, by geometrical discontinuities of disk 1; these geometrical discontinuities coinciding with limits 16,17 between the first surface 3, where the tungsten is to be kept, and the second surface 4,5,6 where the tungsten is to be removed. Such geometrical discontinuities may be formed, as in the non-limiting example described, by the line of intersection 10 and by groove 11; assuming that groove 11 is replaced by a projecting discontinuity (not shown), the desired fragilization of the tungsten layer 22 will be obtained in the same way. In the previously mentioned case illustrated in FIG. 1, in which the second mask 8 comprises an upper part 8A, the upper face 2 may comprise in coincidence with the second outer limit 17A, a second groove for example (not shown) such as groove 11, for ensuring this fragilization of the tungsten layer 22.

Another version of the process of the invention consists in depositing an intermediate layer 15 over the whole of the surface of disk 1. The small thickness of this intermediate layer (about 0.01 mm) allows it to be readily removed from the second surfaces 4,5,6; this removal being possibly achieved by chemical or mechanical processes such as, for example, scratching or machining.

A process in accordance with the invention is applicable in all cases where a graphite piece is to be coated with a refractory metal, such as tantalum or tungsten, over one or more parts of its surface.

What is claimed is:

1. A process for selectively depositing a tungsten or tantalum refractory metal layer on a graphite piece, comprising masking selected surfaces of said graphite piece with a masking material to establish graphite surfaces which exhibit poor adhesion to said metal, depositing only on selected unmasked surfaces of said graphite piece an intermediate layer of a coating material which promotes strong adhesion between said unmasked surfaces and an outer layer of said refractory metal, removing said masking material from said selected surfaces to form corresponding unmasked surfaces, depositing said refractory metal over both of the formerly masked surfaces and the thus coated unmasked surfaces, and removing from said formerly masked surfaces the refractory metal poorly adhered thereto.

2. A process as claimed in claim 1, wherein said intermediate layer is deposited by electrolysis and said masking material comprises an electrically insulating material to avoid deposition of said intermediate layer thereon.

3. A process as claimed in claim 2, wherein said intermediate layer comprises rhenium.

4. A process according to claim 1, wherein said graphite piece is heated in a protective atmosphere after deposition of said refractory metal layer, so as to promote removal of said refractory metal layer from said formerly masked surfaces.

5. A process according to claim 1, wherein said refractory metal layer deposited on said formerly masked surfaces is removed by mechanical means.

6. A process as claimed in claim 5, wherein removal of said refractory metal layer from said formerly masked surfaces is obtained by subjecting said graphite piece to shock.

7. A process as claimed in claim 5, wherein removal of said refractory metal layer from said formerly masked surfaces is obtained by machining said graphite piece.

8. A process as claimed in claim 1, wherein the surfaces coated by said intermediate layer are defined by inner and outer means providing barriers forming a discontinuous surface on said graphite piece.

* * * * *